United States Patent
Inoue et al.

(10) Patent No.: US 8,362,516 B2
(45) Date of Patent: Jan. 29, 2013

(54) SEMICONDUCTOR LIGHT EMITTING DEVICE

(75) Inventors: Yoshiki Inoue, Anan (JP); Masahiko Sano, Anan (JP)

(73) Assignee: Nichia Corporation, Anan-shi (JP)

(\*) Notice: Subject to any disclaimer, the term of this patent is extended or adjusted under 35 U.S.C. 154(b) by 0 days.

(21) Appl. No.: 13/431,665

(22) Filed: Mar. 27, 2012

(65) Prior Publication Data

US 2012/0181572 A1 Jul. 19, 2012

Related U.S. Application Data

(62) Division of application No. 11/785,201, filed on Apr. 16, 2007, now Pat. No. 8,168,996.

(30) Foreign Application Priority Data

Apr. 17, 2006 (JP) .................................. 2006-113926
Mar. 8, 2007 (JP) .................................. 2007-58866

(51) Int. Cl.
*H01L 33/40* (2010.01)

(52) U.S. Cl. ............... 257/99; 257/81; 257/91; 257/734; 257/776; 257/786; 257/E33.055; 257/E33.062; 257/E33.065; 257/E33.066; 257/E23.043

(58) Field of Classification Search ............... 257/99, 257/E33.062, E33.065, 81, 91, 734, 776, 257/786, E33.055, E33.066, E23.043
See application file for complete search history.

(56) References Cited

U.S. PATENT DOCUMENTS

| | | | | |
|---|---|---|---|---|
| 5,258,629 A | * | 11/1993 | Itoh et al. | 257/88 |
| 5,661,313 A | * | 8/1997 | Dubbelday et al. | 257/103 |
| 6,307,218 B1 | * | 10/2001 | Steigerwald et al. | 257/99 |
| 6,360,352 B2 | | 3/2002 | Wallace | |
| 6,514,782 B1 | * | 2/2003 | Krames et al. | 438/22 |
| 6,958,498 B2 | * | 10/2005 | Shelton et al. | 257/99 |
| 7,180,182 B2 | * | 2/2007 | Kobayashi et al. | 257/734 |
| 7,615,798 B2 | * | 11/2009 | Sanga et al. | 257/99 |
| 2003/0107053 A1 | * | 6/2003 | Uemura et al. | 257/200 |
| 2003/0230754 A1 | * | 12/2003 | Steigerwald et al. | 257/91 |
| 2004/0012958 A1 | | 1/2004 | Hashimoto et al. | |
| 2007/0085095 A1 | * | 4/2007 | Ko et al. | 257/94 |

FOREIGN PATENT DOCUMENTS

| | | |
|---|---|---|
| JP | 58-101454 A | 8/1983 |
| JP | 9-219539 A | 8/1997 |
| JP | 9-232632 A | 9/1997 |
| JP | 11-135501 A | 5/1999 |
| JP | 2000-184930 A | 6/2000 |
| JP | 2001/345480 A | 12/2001 |

(Continued)

OTHER PUBLICATIONS

Merriam Webster OnLine definition of "endpoint." No date.

(Continued)

*Primary Examiner* — Hrayr A Sayadian
(74) *Attorney, Agent, or Firm* — Birch, Stewart, Kolasch & Birch, LLP

(57) ABSTRACT

An excellent light emitting element capable of improving problems caused by a material having high light-reflectivity and susceptible to electromigration, especially Al used for the electrode. FIG. 2A depicts semiconductor light emitting element having a first and second electrodes 20 and 30 disposed at a same surface side respectively on a first and second conductive type semiconductor layer 11 and 13. In the electrode disposing surface, the first electrode 20 comprises a first base part 23 and a first extended part 24 extending from the first base part, and a plurality of separated external connecting parts 31 of the second electrode 30 arranged side by side in extending direction of the first extended part.

21 Claims, 5 Drawing Sheets

| | FOREIGN PATENT DOCUMENTS | | JP | 2006245230 A | 9/2006 |
|---|---|---|---|---|---|
| JP | 2002-319705 A | 10/2002 | | | |
| JP | 2003-197966 A | 7/2003 | | | |
| JP | 2004-56109 A | 2/2004 | | | |
| JP | 2005-019646 A | 1/2005 | | | |
| JP | 2005-64485 A | 3/2005 | | | |

OTHER PUBLICATIONS

Merriam Webster OnLine definition of "group." No date.

* cited by examiner

SEMICONDUCTOR LIGHT EMITTING DEVICE

This application is a Divisional of U.S. application Ser. No. 11/785,201 filed on Apr. 16, 2007 now U.S. Pat. No. 8,168,996, and for which priority is claimed under 35 U.S.C. §120; and this application claims priority to Japanese Patent application Nos. 2006-113926 filed on Apr. 17, 2006 and 2007-58866 filed on Mar. 8, 2007; the entire contents of all these applications being herein incorporated by reference.

BACKGROUND OF THE INVENTION

1. Field of the Invention

The present invention relates to a semiconductor light emitting device, in detail to a semiconductor light emitting device having a pair of electrodes formed at the same surface side of the semiconductor light emitting device, and specifically to a semiconductor light emitting device with a face-down structure in which an electrode forming side is a mounting side.

2. Description of the Related Art

Various research and development activities have been conducted to realize a large area light emitting device comprising a stacked layer structure of semiconductor layers.

For example, in the device having nitride semiconductor layers stacked on an insulating substrate such as a sapphire substrate, a part of the p-type semiconductor layer and active layer are removed in the depth direction to expose the n-type semiconductor layer, and a pair of electrodes of n-electrode and p-electrode are provided on these surfaces of the semiconductor layers, that is, a same surface side of the nitride semiconductor layers.

These n-electrode and p-electrode respectively comprise a seat and an extended part so as to avoid excessive concentration of electric current at a specific region and to diffuse the electric current in a wider region. For example, refer to patent literature references 1 to 5 listed below.

Patent literature 1: Japanese Unexamined Patent Application Publication No. 2001-345480A.
Patent literature 2: Japanese Unexamined Patent Application Publication No. 2000-345480A.
Patent literature 3: Japanese Unexamined Patent Application Publication No. 2004-056109A.
Patent literature 4: Japanese Unexamined Patent Application Publication No. 2002-345480A.
Patent literature 5: Japanese Unexamined Patent Application Publication No. 2005-019646A.

SUMMARY OF THE INVENTION

In the electrode structure shown in FIG. 1A, an n-electrode has an extended part extending from a pad part and narrow than the pad part, and an external connecting part of a p-electrode side is arranged substantially in parallel with the extended part.

With this structure, if Al, Ag and the like in which the electro-migration easily occur is used for the n-electrode (extended part), an electromigration concentrating portion is formed as shown in FIG. 1B and a part or entire constitutive member of the electrode disappears to cause disconnection and detachment and the like in the region other than the concentrated part.

In addition, the electric current from the wider pad part is constricted in the extended part, which may result in deterioration or destruction of a part of the electrode.

The present invention has been devised to solve the above problems, and therefore, is aimed at providing a highly efficient nitride semiconductor device in which a material having high light-reflectivity and being susceptible to electromigration, especially Al, is used for the electrode.

The light emitting device of the present invention includes constructions illustrated below.

According to a first embodiment of the present invention, there is provided;

(1) A semiconductor light emitting device 100 having a first and second electrodes 20 and 30 disposed at a same surface side respectively on a first and second conductive type semiconductor layer 11 and 12. In the electrode disposing surface, the first electrode 20 comprises a first base part 23 and a first extended part 24 extending from the first base part, and a plurality of separated external connecting parts 31 of the second electrode 30 arranged side by side in extending direction of the first extended part.

In other semiconductor light emitting devices according to the first embodiment;

(a) the plurality of external connecting parts 31 are provided between the first bases 23 opposing each other in the extending direction of the first extended part of the first electrode 20 and/or between the first extended parts 24.

(b) at least a part of an external connecting part 31 of the second electrode 30 overlaps with the extended part 24 in the extending direction.

According to a second embodiment of the present invention, there is provided;

(2) A semiconductor light emitting device 100 having a first and second electrodes 20 and 30 disposed at a same surface side respectively on a first and second conductive type semiconductor layer 11 and 12. In the electrode disposing surface, the first electrode 20 has a plurality of electrodes each comprising a first base part 23 and a first extended part 24 extending from the first base part, and a plurality of external connecting parts 31 of the second electrode 30 are provided side by side so as to traverse the first electrode or between the base parts to the first electrode or a region between the base points, a plurality of external connection parts 31 of the second electrode 30 which are separated each other are placed side by side at a side of the first extended part along a extending direction of the first extended part 24, the plurality of external connecting portions 31 of the second electrode in the region of the electrode each has external connecting portion at both end parts 31a and 31c and intermediate external connecting parts 31b provided between the external connecting parts at both end parts, and the intermediate external connecting parts 31b are provided in a region between the end parts of the extended parts 24, and a part of the external connecting part 31a and 31c of at least one of end parts overlaps with the extended part 24.

According to a third embodiment of the present invention, there is provided;

(3) A semiconductor light emitting device 100 having a first and second electrodes 20 and 30 disposed at a same surface side respectively on a first and second conductive type semiconductor layer 11 and 12. In the electrode disposing surface, the first electrode 20 has a plurality of electrodes each comprising a first base part 23 and a first extended part 24 extending from the first base part, and a plurality of external connecting parts 31 of the second electrode 30 are provided side by side so as to traverse the first electrode or between the base parts to the first electrode or a region between the base points, a plurality of external connection parts 31 of the second electrode 30 which are separated each other are placed side by side at a side of the first extended part along a extending direction of the first extended part 24, the external connecting parts form a group region 32 in which the external connecting parts are placed at a short period or within a short distance, each group region is arranged at longer distance than a distance between the external connecting parts in the group region or each group region is arranged with a configuration having a long period in the arrangement direction of the external connecting parts in the group region, and the first electrode 20 or at least a part of the first electrode is provided between the group regions 32.

Other semiconductor light emitting devices according to the each embodiment shown above may include such as:

(a) an external connecting part which is different than the external connecting part 31 overlapping with the first extended part 24 of the second electrode 30 is arranged so as to be separated from an extended end of the extended part 24 in extending direction.

(b) the first electrode comprises a first layer at contacting side with the first conductive type semiconductor layer, a second layer on the first layer, and an Al alloy.

(c) the Al alloy contains Cu or Si and Cu.

(d) the base part 23 of the first electrode is an external connecting part 25 and is wider than the extended part 24.

(e) in a different direction than the extending direction, a plurality of first electrode are arranged and an external connecting part 34 of the second electrode 30 is spaced apart from the region between the base parts.

(f) array direction of the external connecting parts 31 of the second electrode 30 and extending direction of the extended part 24 are approximately in parallel and arranged to be spaced apart each other.

(g) the second electrode 30 at least has a first layer at the second conductive type semiconductor layer 12 side and a second layer on the first layer, and the first layer has a higher reflectivity to light from the light emitting device than that of the second layer, and the external connecting part 31 of the second electrode is provided on the second layer of the second electrode.

According to a fourth embodiment of the present invention, there is provided;

(4) A semiconductor light emitting device 100 having a first and second electrodes 20 and 30 disposed at a same surface side respectively on a first and second conductive type semiconductor layer 11 and 12. In the electrode disposing surface, the first electrode 20 comprises a first base part 23 and a first extended part 24 extending from the first base part, and a plurality of separated external connecting parts 2 of the second electrode 30 arranged side by side in extending direction of the first extended part. In the width direction, the external connecting part of the second electrode is apart from the region between the base part of the first electrode, a part of the external connecting part is provided in a region between the extended parts, and a spacing between the external connecting parts is arranged apart from the region of the extended part.

Other semiconductor light emitting devices according to the first embodiment may include:

(a) the external connecting parts are arranged in the array direction at substantially regular intervals each other.

(b) the first and second electrodes are arranged in a different direction from the array direction of the external connecting parts of the second electrode and/or a facing direction of the first electrode.

(c) the extended parts extend in a direction substantially the same as the facing direction of the first electrode.

Thus, according to the present invention, by using a electrode material having high reflectivity to the light from the light emitting element while controlling electromigration of the material, a light emitting device with high reliability, excellent light reflectivity and light extraction efficiency and consequently has excellent light output can be obtained.

Especially, in a light emitting device of a large area which is driven with a high-current, excellent emission property and reliability can be obtained.

Also, even when a material with low electromigration is used, deterioration and burn-in due to current concentration and the like may occur. However, in the light emitting device according to the present invention, such problems can be improved.

DETAILED DESCRIPTION OF THE PREFERRED EMBODIMENTS

Now the present invention will be described more fully hereinafter by way of preferred embodiments with reference to the accompanying drawings.

(Embodiment 1)

Figure 2A:
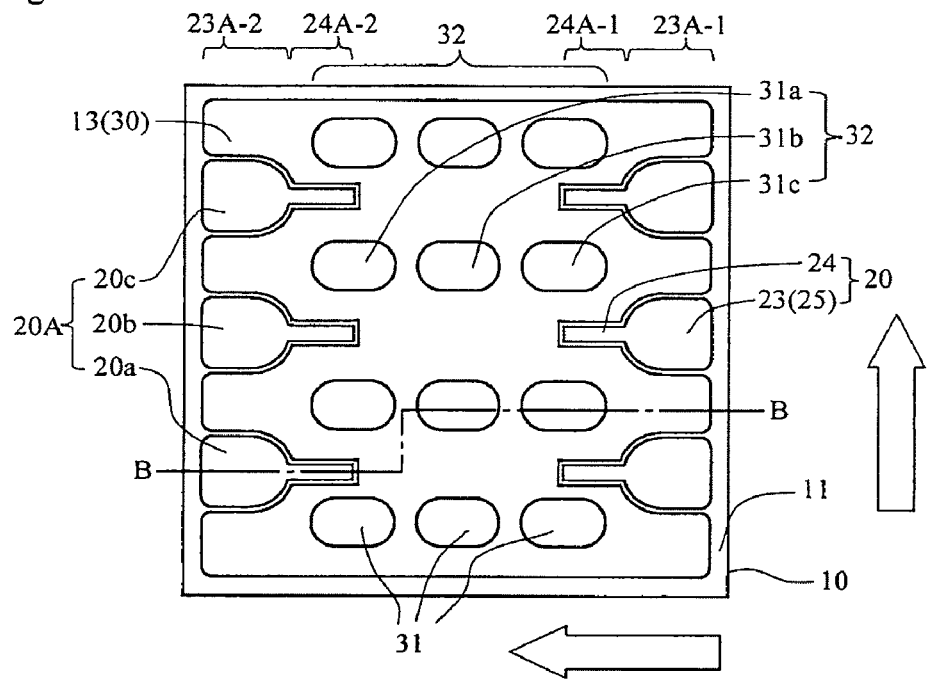
FIG. 2A is a schematic plan view showing a layered member mounted on a multilayer substrate of a light emitting device according to an embodiment of the present invention.
Figure 2B:
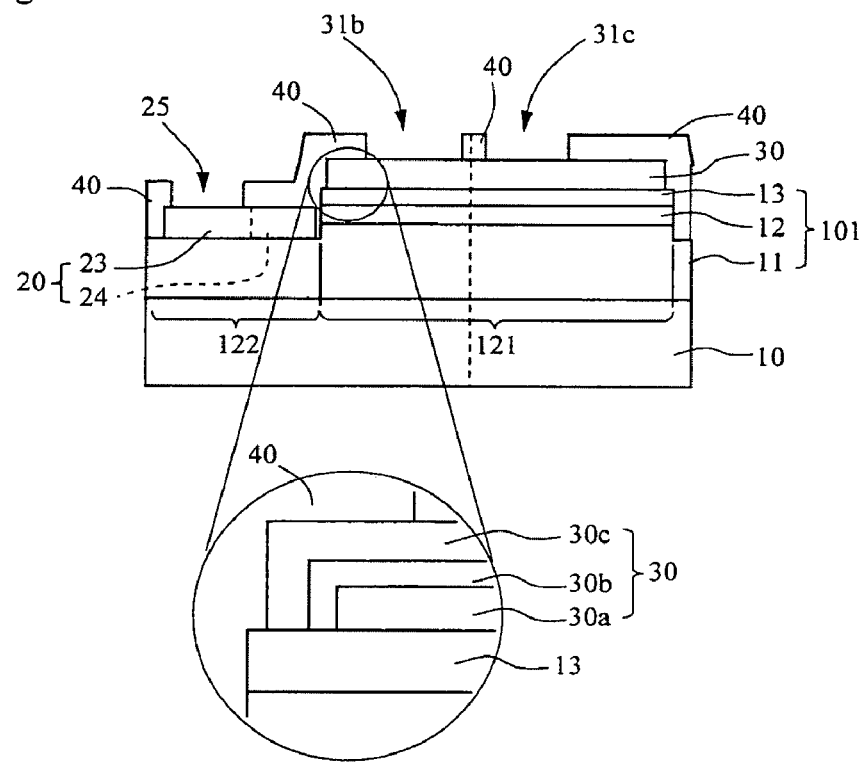
FIG. 2B is a schematic cross sectional view taken along line B-B of FIG. 2A.

A semiconductor light emitting device 100 comprises, as shown in FIG. 2B, generally, a first conductive type semiconductor layer 11, a light emitting layer 12 and a second conductive type semiconductor layer 13 stacked in sequence on a substrate 10, and a second electrode 30 formed on the second conductive type semiconductor layer 13.

In the semiconductor light emitting device, in a part of region of a semiconductor element, the second conductive type semiconductor layer 13 and the light emitting layer 12, and arbitrarily a part of the first conductive type semiconductor layer are removed in a depth direction to expose a surface, and a electrode forming region 122 whereon a first electrode 20 is disposed in provided in a part of the exposed surface, and a light emitting structure 121 is fabricated in the rest of the region.

Thus, the first electrode 20 and the second electrode 30 are arranged in the same surface side of the semiconductor layers.

In addition, as shown in FIG. 2, a first electrode 20 is disposed opposite to the second electrode 30, in other words, the second electrode is disposed between the first electrodes.

The first electrode comprises a first base part 23 and at least one first extended part 24 extending from the base part.

For example, as shown in FIG. 2, the first electrode 20 comprises the base part 23, a part of which to be an external connecting part 25, and the first extended part 24.

With to such structure, the electric current can be diffused widely from the first electrode to the first conductive type semiconductor layer 11, especially from the extended parts in the extending direction, so that the electric current can be injected widely to the inner portion of the element.

At this time, the first conductive type layer 11 also functions as a current diffusion conductor. For example, in the device, the first conductive type layer 11 performs current diffusion in the region between each first electrode 20 which are spaced each other, specifically, the region between the electrodes in the extending direction, and the region between the array regions 23A-1 and 23A-2 where the first electrodes are arranged.

The external connecting part 31 of the second electrode 30 is, as shown in FIG. 2B, provided as an opening part of an insulating film 40 disposed on the approximately entire surface of the second conductive type layer to cover the second electrode 30.

In this case, most of the surface of the second electrode may be exposed from the protective film to provide a plurality of external electrodes on the exposed surface of the electrode.

In addition, the external connecting parts 31a to 31c of the second electrode 30 are arranged side by side on the second electrode on the second conductive type semiconductor layer. The array structure is a two-dimensional array structure comprising a primary array of the external connecting parts 31a to 31c which are arranged one-dimensionally in direction shown by the lateral arrow in FIG. 2A, and an secondary array of the group 32 formed with arrays of the external connecting parts arranged one-dimensionally is arranged in a direction approximately perpendicular (shown by the longitudinal arrow in FIG. 2A) to the one-dimensional array direction.

Different than that in the secondary array direction, the primary array direction of the external connecting parts which are constituents of the group 32 are arranged closely each other in the one-dimensional array direction compared with that in the two-dimensional array direction, without neither straddling nor interposing the first electrode or the first conductive type semiconductor layer.

With this arrangement, in the primary array direction, the array is arranged one-dimensionally so as to be approximately in parallel with the extending direction of the extended part 24 of the first electrode 20.

In the secondary array direction, a distance between the groups 32 is larger than a distance between the external connection parts of the primary array and a part of the first electrodes and a part of exposed parts of the first conductive type semiconductor layer are arranged between the groups 32. Specifically, the external connecting parts 31a and 31c which are at an end side in the groups 32 partially overlap in the extending direction.

On the other hand, for the first electrodes, the primary array direction is a direction along which the electrodes are arranged close to each other as in the second electrode and approximately parallel to the secondary array direction of the second electrode, which is the direction shown by the longitudinal arrow in FIG. 2A. In addition, the extending direction of the extended parts is a direction which is approximately perpendicular to the primary array direction. In the extending direction, at a greater distance than that of the primary array, in a similar way as in the second electrode, the first electrodes of the primary array are arranged as secondary array to construct a two-dimensional array structure.

The first electrodes are facing each other in the secondary array direction and each extended part is extended in the facing direction that is an inward direction between the electrodes.

Ether of the base part or the extended part may be provided singularly or plurally.

In the structure of this case, in the direction shown by the longitudinal arrow in FIG. 2A, the first electrode of secondary array and the external connecting parts of the second electrode (group 32) are arranged alternately, and in the direction shown by the lateral arrow in FIG. 2A, the first electrodes (23A, 24A) of primary array and the group 32 of the external connecting parts of the second electrode of secondary array are arranged alternately.

As described above and shown in comparative example 1 and FIG. 1 (FIG. 1B), similarly to the case where the external connecting parts 25 (second electrode) are arranged in primary array in the direction approximately perpendicular to the extending direction of the extended parts 24 of the first electrodes, an electric current concentration portion also occurs in Embodiment 1.

Specifically, in the example shown in FIG. 2, it seems that the electric current tends to concentrate in the second conductive type semiconductor layer side (within the second electrode) than in the external connecting parts 31b arranged at the intermediate part in the groups of the external connecting parts of the second electrode which are arranged in rows, or in the vicinity thereof, for example, the region between the external connecting parts 31a and 31c which are adjacent to the external connecting parts 31b, and the region which is the intermediate external connecting parts 31b side arranged at the end part side such as the both end sides in the group 32.

Electromigration may be induced when the current concentration portion and a first electrode with a slender shape such as the extended part are formed at the external connecting part.

On the other hand, as in Embodiment 1, Al migration in the first electrodes, deterioration and burning of the first electrode can be prevented and a light emitting device of high reliability can be obtained, by providing the first electrodes 20 spaced from the current concentration portion of the second conductive type semiconductor layer side to form the primary array region 23A and 24A of the first electrodes, overlapping the extended parts which are a part of the array region 24 in a centrifugal (distal) direction at the end side of the group 32 of the second electrode

EXAMPLE 1

As shown in FIG. 2, an n-type nitride semiconductor layer 11, an active layer 12, and a p-type nitride semiconductor layer 13 are stacked to form a semiconductor structure 101 on a substrate 10 via an underlayer (not shown) of a nitride semiconductor made of GaN. Then, a part of the structure is removed by etching to expose the n-type layer for a region whereon an n-electrode (first electrode) to be formed.

A p-electrode of Ni/Ag on the p-type layer and an n-electrode made of a first layer of Al—Si-an al alloy of Cu and a second layer of W/Pt/Au on the first layer are stacked in sequence. Thus, a 1 mm-square light emitting element chip is obtained.

Comparative Example

Figure 1A:
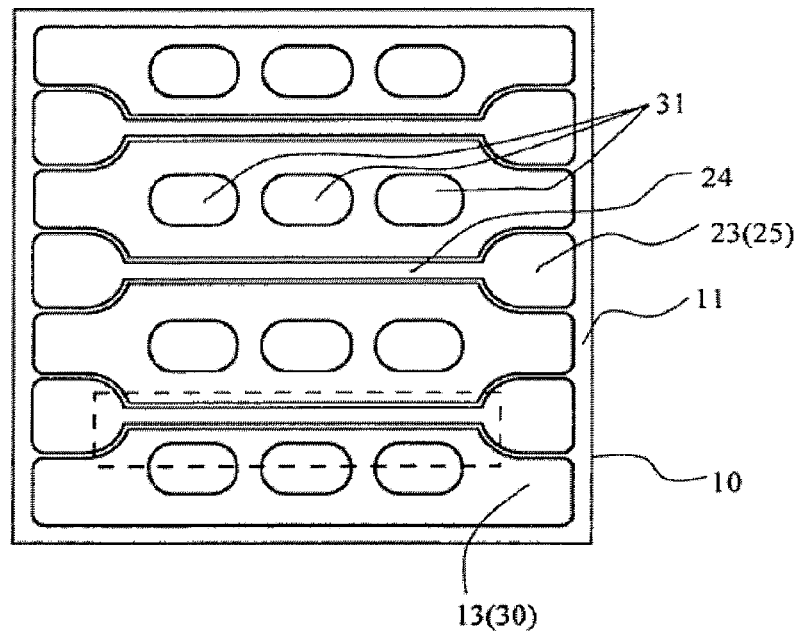
FIG. 1A is a schematic plan view of a light emitting device according to a comparative example of the present invention.

As shown in FIG. 1, in Example 1, the extended part 24 is formed so as to connect the base parts 23.
(Electrode Structure)

The electrode structure of Example 1 shown in FIG. 2 is illustrated to describe the electrode structure of the present invention.

As described above, a reflecting electrode is provided to each p-electrode 30 and n-electrode. As shown in detail in a partially enlarged view of the circled portion in FIG. 2B, the p-electrode consists of three layers of a first layer 30a made of sequentially stacked layer of Ni/Ag/Ni/Ti/Pt with a thickness of 0.6 nm/100 nm/100 nm/100 nm, a second layer 30b made of Au film which covers the first layer, and a third layer 30c made of Au/Rh/Pt/Au with a thickness of 100 nm/400 nm/100 nm/600 nm stacked in sequence which covers the second layer. On the other hand, the n-electrode has a structure in which a second layer of W/Pt/Au with a thickness of 200 nm/100 nm/500 nm is stacked in sequence on a first layer made of an Al alloy with a thickness of 500 nm.

As described above, the reflective electrode structure of each p-electrode and n-electrodes is provided in the first layer or the lowest part of the first layer. That is, the functions of ohmic connection and light reflection are provided at the first layer or the lowest part thereof, in particular, at the al alloy in the first layer of the n-electrode and Ni/Au located at the lowest part of the first layer of the p-electrode.

Thus, Ag, Al, Rh and an alloy thereof have high reflectivity in the visible region and near-ultraviolet region and are suitably used as the light reflecting film in bottom part of the semiconductor side.

As in Example 1, it is preferable to form the electrode provided to the light emitting structure 121 and a non-emitting part such as the electrode forming part 122, further to form a large-area electrode and a small-area electrode, with a high light reflecting film and a low light reflecting film by using an Ag alloy or an Al alloy, so that light of the light emitting structure in the main emitting part can be suitably reflected.

In the present example at light emitting wavelength of 450 nm, the reflectivity at Ni—Ag which is the lowest part of the first layer of the p-electrode is about 92% and the reflectivity at Al—Si—Cu alloy of the first layer of the n-electrode is about 81%.

An electrode provided to the non-emitting part, for example, the aforementioned n-electrode, will be described below with regard to the relationship between above-described Al-migration and the material for the electrode.

Each element is prepared according to Comparative example 1 except that in each example below and Comparative example 2, the n-electrode is formed with various materials and structures.

Comparative Example 2

An element is fabricated according to Example 1 except that the first layer of the n-electrode of the Example 1 is omitted and the n-electrode is formed with the second layer.

EXAMPLES 2 to 6

EXAMPLE 2

An element is fabricated in a similar manner as the element in Comparative Example 1, except that the first layer of the n-electrode is made of Al and 1 wt % of Cu, instead of Al and 2 wt % of Cu and 1 wt % of Si in that of Example 1, and Al—Si—Cu as in Example 1. [Example 3] An element is fabricated in a similar manner as the element in Comparative Example 1, except that the first layer of the n-electrode is made of Al and 2 wt % of Cu, instead of Al and 2 wt % of Cu and 1 wt % of Si in that of Example 1, and Al—Si—Cu as in Example 1. [Example4] An element is fabricated in a similar manner as the element in Comparative Example 1, except that the first layer of the n-electrode is made of Al and 3 wt % of Cu, instead of Al and 2 wt % of Cu and 1 wt % of Si in that of Example 1, and Al—Si—Cu as in Example 1. [Example 5] An element is fabricated in a similar manner as the element in Comparative Example 1, except that the first layer of the n-electrode is formed with a thickness of 200 nm. [Example 6] An element is fabricated in a similar manner as the element in Comparative Example 1, except that the first layer of the n-electrode is formed with two kinds of Al—Si—Cu alloys.

According to Examples 4 and 5, the emission power tends to increase by about 10 to 15% compared to Comparative Example 2, about 114% in Example 4 and about 110% in Example 5, and the light output power comparable with about 115% of Al single layer can be obtained.

Driving Vf at 100 mA in comparison with each Example and Comparative Example 2, VF values in Al—Si—Cu in Examples 5 and 6 and three Al—Cu alloys in Examples 2 to 4 tend to be at the same level or 0.1 to 0.3 V lower than that in Comparative Example 2, at the same level in comparison between Al—Si—Cu in Example 5 and Al—Cu in Examples 2 to 4, and the higher contents of Cu in an Al—Cu alloy, the higher Vf value.

Light emitting power tends to be higher with higher Cu content in Al—Cu alloy (Examples 2 to 4). In comparison between Al—Si—Cu (Example 5) and Al—Cu (Examples 2 to 4), the light emitting power tends to be slightly higher in Al—Si—Cu (Example 5) than that in Al—Cu with higher Cu content (example 4). In comparison of Al—Si—Cu film thickness (Examples 5 and 6), the light emitting power tends to be higher according to Example 6.

Optical reflectance is about 84% with Al single layer, about 81% according to Example 5, and about 82% according to Example 4.

Figure 1B:
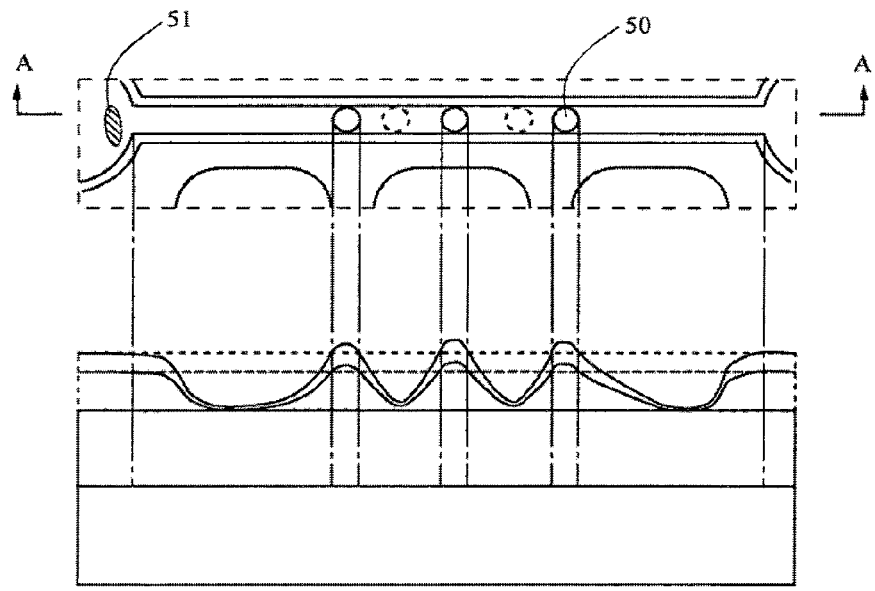
FIG. 1B is a partially enlarged plan view (upper figure) showing a part framed by a dotted line in FIG. 1A and a schematic cross-sectional view (lower figure) taken along line AA of the framed figure.

Further, when the degradation defect 51 at the external connecting part 25 such as shown in FIG. 1B in the device according to Examples 2 to is evaluated by driving at 1 A for 300 hours, there is tendency that the number and rate of defect 51 tends to decrease with lower Cu content in Examples 2 to 4, and at approximately same level in Examples 4 and 5.

The degradation defect 51 is observed in the wide base part 23 (external connecting part 25), especially in a region near the narrowing portion from the base part to narrow extended part 24.

Further, with the drive condition at 350 mA and 700 mA, defect 51 tends to occur in Examples with the Al single film at 350 mA, but the defect does not tend to occur in Examples 4 and 5 even at 700 mA.

As described above, an Al alloy containing at least Cu or an Al alloy containing Cu and Si is preferable for the light reflecting film of the lowest portion (first layer) of the first electrode in a non-emitting portion such as the electrode forming part 122, specifically the n-electrode of the n-type nitride semiconductor layer. In addition, when the Cu content of the Al alloy is 2 wt % or more, further, 3 wt % or more is more preferable.

The upper limit of the Cu content and Si content is not specifically limited, but for example, it is about 10 wt % or less, further 5 wt % or less.

Also, when the first electrode comprises a wide base part 23 (external connecting part 25) and narrow extended part 24, the above-mentioned Al alloy can be used suitably in combination, and the element with excellent light emitting power and reliability can be obtained (Embodiment 2)

Figure 3:
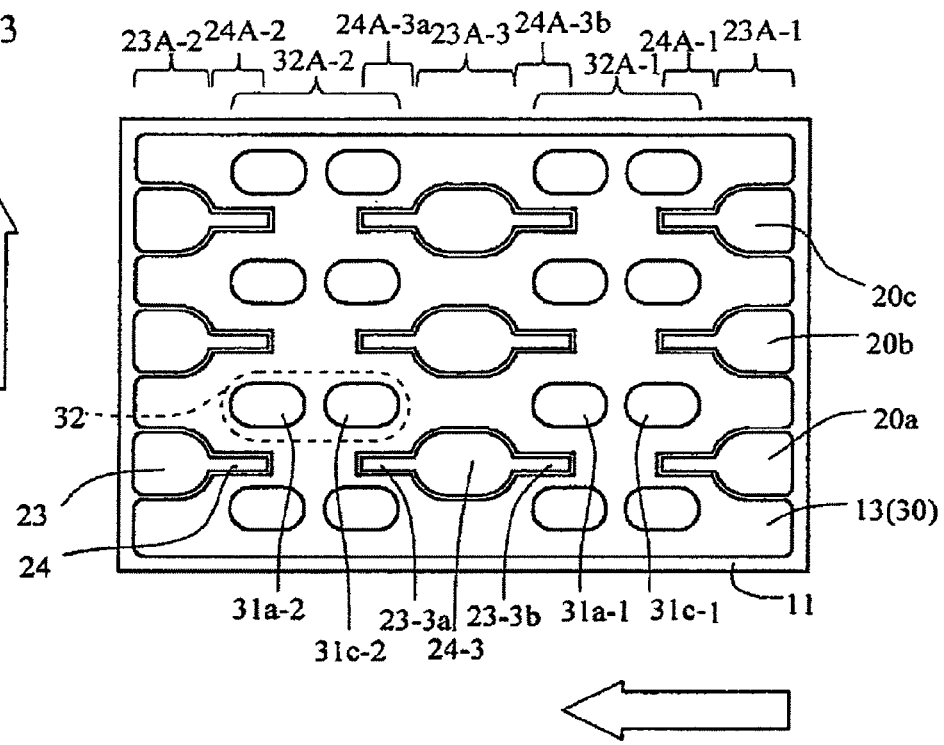
FIG. 3 is a schematic plan view showing a layered member mounted on a multilayer substrate of a light emitting device according to an embodiment of the present invention.

As shown in FIG. 3, in comparison with Embodiment 1, the following are different.

The second electrode has a plurality of groups 32 as the long-period structures which are longer than the distance between the primary array of the external connecting parts in the group in the primary array direction (the direction shown by the lateral arrow in FIG. 3).

The first electrode has the electrodes arranged in the primary array direction shown by the longitudinal arrow in FIG. 3. That is, in addition to the regions (23A-1 and 2, and 24A-1 and 2) at the device side, the first electrode has the intermediate regions (23A-3 and 234A-3) between thereof.

In the secondary array direction (extending direction of the extended parts) of the first electrodes, the distance between the electrode regions (23A-1 and 2, and 24-A and 2) at the peripheral side of the device are made larger and the first electrodes having a different shape are provided between the electrodes of larger distance.

Specifically, the electrodes of each region respectively has a structure comprises a base part 20 and an extended part extending along the electrodes of the secondary array direction. In which, an electrode at periphery side has a base part and an extended part extending to one side, and an electrode at inner side has a base part 23-3 and the extended parts 24-3$a$ and $b$ at the both sides of the base part.

In addition, in the second electrode, the intermediate external connecting part corresponding to 31$b$ in FIG. 3 is omitted and as described above, the group region 32 composed of two external connecting parts 31$a$-1 and 31$c$-2 with a short-period in the primary array direction, and via 2 of the first electrodes, the groups 32 of a longer-period, for example, 32A-1 and 32A-2 are arranged.

In the present embodiment, different than in Embodiment 1, the intermediate connecting part is not provided in a group region. Therefore, the electric current concentrating region in the Embodiment 1 is provided between the two external connecting parts (31$a$-1 and 31$c$-2) and the adjacent portions thereof, a side of adjacent external connecting parts of each external connecting part.

By arranging the group region 32 at a long-period array in a two-dimensional direction with a longer distance than the external connecting portions within the group as described above, the electric current concentrating portion at the second conductive type-side can be provided in the group region, especially, at its inner region which corresponds to the intermediate external connecting part 31$b$ in Embodiment 1, and the first electrode (its arranging region) is provided in the other region, so as to form a light emitting element structure with a high reliability.

(Embodiment 3)

Figure 4:
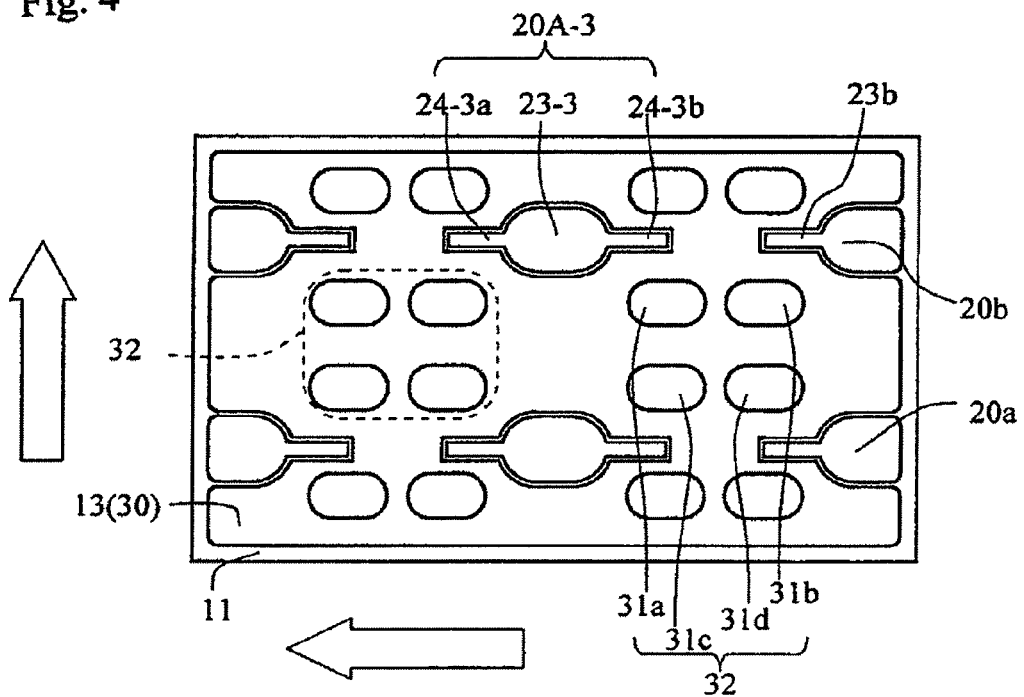
FIG. 4 is a schematic plan view showing a layered member mounted on a multilayer substrate of a light emitting device according to an embodiment of the present invention.

The light emitting element of Embodiment 3 shown in FIG. 4 has a structure different from that in Embodiment 1, in which a part of the group region 32 has four external connecting parts 31$a$ to 31$c$, and the external connecting parts 31$a$ and 31$b$ (31$c$ and 31$d$) of one-dimensional array (lateral arrow direction in the figure) is provided in two rows.

The electric current concentration part at the second conductive-type side is formed within the group region near the center of the four external connecting parts.

The first electrode is provided apart from the concentration part.

(Embodiment 4: Mounting Shape)

Figure 5:
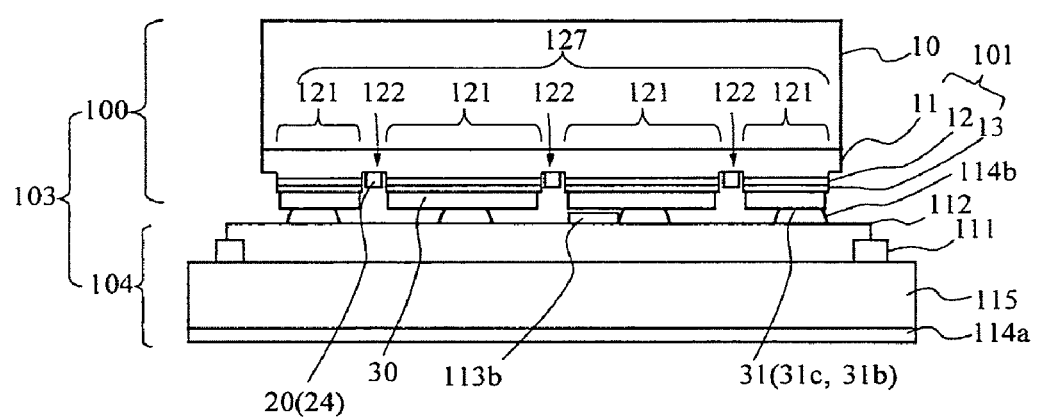
FIG. 5 is a schematic cross sectional view showing a layered member mounted on a multilayer substrate of a light emitting device according to an embodiment of the present invention.
Figure 6:
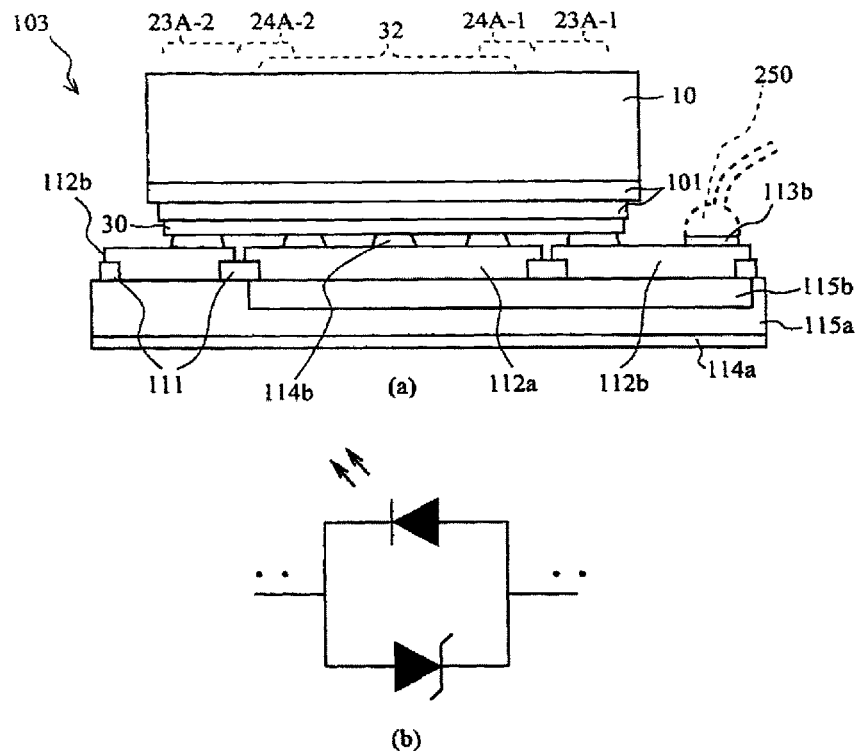
FIG. 6 is a schematic side view (a) showing a layered member mounted on a multilayer substrate of a light emitting device according to an embodiment of the present invention and a diagram (b) showing an equivalent circuit thereof.

The layered body 103 of the light emitting element according to Embodiment 4 shown in FIGS. 5 and 6 is a element layered body 103 bonded to the multilayer substrate 104 which is the support substrate of the light emitting device 100, at the electrode forming surface of the light emitting device 100.

In this case, FIG. 5 shows a cross-sectional view of the element layered body 103 as seen in the cross-section in two dimensional direction of the external connecting part 31 of the second electrode in the extended region 23A-1. FIG. 6 shows the structure of side surface of the element layered body perpendicular to its cross section, in which the region 23A (24A) of each array of the n-electrode is shown overlapped in (a).

As shown in FIGS. 5 and 6, the light emitting element 100 is made with the element layered structure 103, the first electrode 20 (base part and external connecting part) separated at the element side is connected each other with the substrate 104 side electrode 112, and in a same manner, the divided second electrode (external connecting part 31) is connected each other at the substrate side 104, then, mounted and bonded.

The electrode 112 at the substrate 104 side is insulated and separated by the insulating film 111 and the like corresponding to the electrodes 20 and 30 at the light emitting element 100 side, and the electrodes for external connection 113 (113$a$ and 113$b$) are provided. The element part 115 may be provided to the substrate 104. In this case, as shown in the equivalent circuit (b) of (a) element layered structure 103 in FIG. 6, the p-type layer (first conductive-type layer) 115$a$, the n-type layer (second conductive-type layer) 115$b$ are provided as the electric current protective element (element structure part 115).

In this case, only one element part 115 is provided to each substrate 104, a structure in which two or more of the element parts may be provided and connected with such as the electrode of external part (element 100, mounting substrate 201) and a wiring at the substrate side 104 may be employed. In addition, the protective element can be mounted on the substrate 104 in the light emitting device 200 (mounting part 222) and connected to the light emitting element with such as a wire and wiring.

The electrodes 20 and 30 at the light emitting element 100 side and the electrode 112 of the substrate 104 are connected via a bonding layer 114, but a part of the electrode at the element 100 side or a part of the electrode 112 of the substrate 104 side may be designated a part of the bonding layer and a bonding layer may be formed instead of the pad parts 25 and 31.

Also, the substrate 104 may be a typical submount without having the element structure 115.

The substrate 104 and external may be connected through a wire bond with the electrode 113 for connection. Alternately, the electrode or the electrode layer conducting interior and exterior portions of the element structure of the substrate 104 may be disposed to the mounting side as the electrode 113 and the jointing layer 114.

(Bonding Layer 114, Bonding Member 204)

The bonding layer 114 and the bonding member may be used for bonding between the element structure 101 (element 100) and the layered substrate 104, bonding and joining of the light emitting element 100, the support substrate and the layered substrate 104 with the mounting substrate 201 (housing part 202) of the light emitting device 200.

A mixture, a complex composite (organic material), and a solder such as an Ag paste, a carbon paste, an ITO paste for the material and the structure, and in view of heat dissipation from the light emitting element 100, a metal such as Au, Sn, Pd and In, a layered body of the metal and an alloy thereof are effective for the present invention with a wire area, large drive current, and high heat dissipation.

Au—Sn, Sn—Pd, or In—Pd is a preferable combination for the first and second eutectic forming layers.

A further preferable combination is Sn for first eutectic forming layer and Au for second eutectic forming layer.

Other, such as a metal-metal junction of a metal bump and an Au—Au junction and the like can be used.

As such a junction layer, an adhesion layer (joining layer) such as an eutectic film, an eutectic multilayer, an alloy layer may be provided via a metalization layer of a layer having good adhesion or via a reflective layer for reflecting light of the above-mentioned light emitting element may be provided to the underlayer side (substrate 10, element structure 101 surface, support substrate, mounting substrate 201, and multilayer substrate 104), or a surface protective film to prevent oxidation may be provided to the surface side thereof. In addition, a metalizing film (an adhesive layer), surface protective film and adhesion film (joining layer) may also be provided to the joining side to bond and join the both layers.

(Element Layered Body 103)

Figure 7:
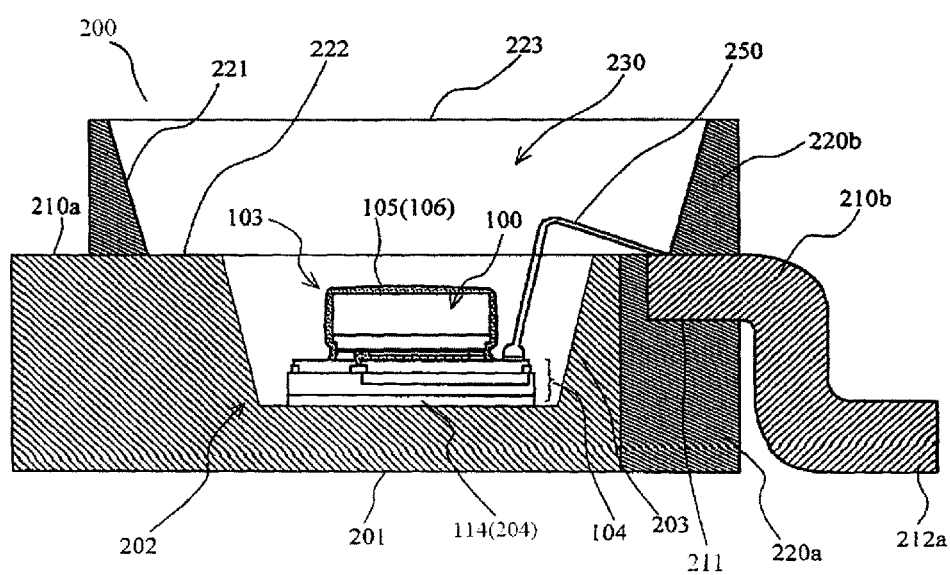
FIG. 7 is a schematic cross sectional view illustrating a light emitting device according to an embodiment of the present invention.

In the present invention, in the case where the light emitting element is mounted on the light emitting device 200, as shown in FIGS. 5, 6, and 7, the element layered structure may be formed by mounting the light emitting element 100 on the layered substrate 104, such as a heatsink and submount, as the layered substrate for mounting light emitting element.

The material for the substrate 104 for multilayer mounting light emitting element 100 is similar to the support substrate and selected in view of the purpose such as heat dissipation and light extracting structure.

Also, such element layered body 103 is connected to the mounting part 202 of the light emitting device 200 with a surface facing the connecting surface to the light emitting element as a mounting side.

In the case where the layered base substrate 104 of the present invention is connected facing the electrode forming surface side of the light emitting element 100, the electrode structures 112a and 112b are formed at the substrate side. In the case where a side of the light emitting element 100 facing the electrode forming surface, for example the substrate 10 side, is connected to the base substrate 104, the electrodes of the base substrate 104 side are not needed and an adhesion layer for connecting may be provided, but an electrode for wire-connecting with the light emitting element 100 may be provided.

The electrode 112 of the base substrate 104 side may be, as shown in the figure, provided only to the connecting surface side to the light emitting element 100. An electrode of mounting side which extends to the mounting surface facing to the connecting surface, an electrode 114 of the base element 104 provided to the mounting surface side, and a mounting surface side which is continuous, joined, or electrically connected from the connecting surface side to the mounting surface side of the light emitting element 100 may be provided.

In addition, in the figure, one light emitting element 101 is mounted on one layered base substrate 104, but a plurality of light emitting elements 101 may be aggregated to one layered base substrate 104, and connected and mounted to the circuit in a manner in parallel, in series, or mixture thereof to form a layered base substrate 103. Also, a plurality of layered base substrate 104 may be provided to one light emitting element 101, for example, element having different functions may be used as the base substrate, or a combination thereof may be employed. Further, a plurality of one of light emitting element 101 or the layered substrate (element) 103 may be stacked in perpendicular direction to form the element layered body 103.

The light emitting element 100 may be, as shown in FIG. 7, covered with a covering film 105, and for a composite thereof, a light transmitting inorganic member or a light transmitting organic member such as $SiO_2$, $Al_2O_3$, $MSiO_3$ (here, M represents Zn, Ca, Mg, Ba, Sr, Zr, Y, Sn, Pb and the like), and a composite containing a phosphor (light converting member 106) is also used suitably.)

The phosphor particles are adhered by such light transmitting inorganic member. Further, the phosphor is deposited in layer on the LED 100 or the support member 104 and bonded thereto.

As the covering layer, other than an insulating protective film covering the element structure 100, a reflective film (Al, Ag etc.) may be provided, or DBR and the like may be formed.

(Light Converting Member 106, Covering Film 105)

The light converting member 106 or the light converting layer in the light emitting device 200 absorbs a part of light of the light emitting element 100 and emits light with different wavelength, and a member containing a phosphor may be used.

Such light converting member 106 or the light converting layer may be applied to cover a part or entire light emitting element 100 as described above, or further, applied to a part of the layered base substrate 104, as the covering film 105.

The binder for the phosphor may be formed by using an oxide and hydroxide at least containing one or more elements selected from the group consisting of Si, Al, Ga, Ti, Ge, P, B, Zr, Y, Sn, Pb or a group of alkaline earth metal, or an organo-metallic compound (preferably further containing oxygen) al least containing one or more elements selected from the group consisting of Si, Al, Ga, Ti, Ge, P, B, Zr, Y, Sn, Pb, or a group of alkaline earth metal.

Here, the term organometallic compound includes compound etc. comprising an alkyl group or an aryl group.

Specific examples of such organometallic compound includes a metalalkoxide, a metal diketobate complex, a metal carboxylate, and the like.

The phosphor used for the light converting member of the present invention is to convert visible light or ultraviolet light emitted from the light emitting element to another wavelength, such as a phosphor excited by light emitted from the semiconductor light emitting layer of the element structure 101 and emits light. A phosphor excited by ultraviolet light or visible light and emits predetermined color of light can also be used.

Specific examples of the phosphor include zinc cadmium sulfide activated with copper and yttrium-aluminum-garnet fluorescent substance activated with cerium (hereinafter referred to as "YAG phosphor").

Especially, for a high luminance, longtime operation, $(Re_{1-x}Sm_x)_3(Al_{1-y}Ga_y)_5O_{12}Ce$ ($0 \leq x < 1$, $0 \leq y \leq 1$, where Re represents at least one element selected from the group consisting of Y, Gd, and La) and the like is preferable.

The phosphor has a garnet structure, and therefore it has properties resistant to heat, light and moisture, and is capable of being adjusted so that its peak wavelength of its excitation spectrum is about 470 nm.

In addition, the luminescent peak wavelength is in the vicinity of 530 nm and it is possible to make a broad emission spectrum which tails to about 720 nm.

In the light emitting device of the present invention, the fluorescent material may be composed of the mixture of at least two kinds.

That is, two or more kinds of phosphors of $(Re_{1-x}Sm_x)_3$ $(Al_{1-y}Ga_y)_5O_{12}$:Ce which include Al, Ga, Y and La, and Gd and Sm in different contents can be mixed in order to increase the wavelength components of RGB.

An irregularity may occur in the emission wavelength of a semiconductor light emitting element. Therefore, at least two kinds of phosphors are mixed in order to obtain a desired mixed light in the white range and the like.

(Light Emitting Device 200)

FIG. 7 shows a light emitting device 200 according to an embodiment of the present invention, in which a light emitting element 100 and its layered body 103 is mounted on a mounting substrate 101.

An example of the light emitting device 200 shown in FIG. 7 may comprises, a lead portion 210 fixed by a device substrate 220, a part of the lead portion used as the mount lead 210 so as to function as mounting substrate 201, a light emitting element 100 (layered body 103) mounted in the housing portion (recessed portion) 202 of the mounting substrate 201 via a connecting layer 114 (adhesion layer 204), a side surface of the recessed portion being a reflecting portion 203, and a base substrate 201 connected to an external radiator so as to function as a heat dissipation portion 205.

In addition, in the device base substrate 202, a terrace portion 222 opening toward the light extracting portion 223 is provided to the exterior of the base substrate 201 and other element such as a protective element may be mounted thereto, the recessed portion 202 and the opening portion of the base substrate 220 are sealed with a light transmitting sealing member 230, and a reflecting portion 203 is also provided to the exterior of the recessed portion 202.

In addition, the lead electrode 210 is connected to outside by an inside lead 211 within the base substrate 220 and an external lead 212 which is an inside lead extended to outside of the base substrate 220.

The light emitting element 100 (layered body 103) is electrically connected to each lead 210 through wire 250 connection and electrical connection 204.

(First and Second Electrodes)

The first and second electrodes may be made of, for example, a single film or a layered film of a metal, an alloy containing at least one selected from the group consisting of nickel (Ni), platinum (Pt), palladium (Pt), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), and yttrium (Y), and an oxide or a nitride thereof and a transparent conductive oxide such as ITO, ZnO, $In_2O_3$.

The film thickness is not specifically limited and can be arbitrarily adjusted according to the characteristics to obtain.

The seating part and extended part constructing the electrode are not needed to be formed integrally, using the same material, at the same time, and may comprise different materials and/or film thickness.

The external connecting part generally preferably has a necessary film thickness and area for the effective function to connect with the external electrode.

(Substrate 10, Semiconductor Structure 101)

For the substrate 10 for forming the first and second conductive type semiconductor layers 11 and 12 which are constituents of the semiconductor light emitting element of the present invention, an insulating substrate such as sapphire or spinel ($MgAl_2O_4$) having C-plane, R-plane or A-plane as a main surface, and an oxide substrate, that lattice matches with the nitride semiconductor, such as SiC (including 6H, 4H, and 3C), ZnS, GaAs, Si, ZnO can be used.

Among them, a sapphire substrate is preferable. The insulating substrate may eventually be removed or may not be removed.

On the substrate, other than the first and second conductive type semiconductor layers, a layer for crystal nucleation or a low-temperature grown buffer layer, a high-temperature grown layer, an intermediate layer and the like can be formed as an under layer.

In the first and second conductive type semiconductor layers, the first conductive type refers to p-type or n-type, the second conductive type refers a conductive type different than that of the first conductive type, that is, n-type or p-type.

Preferably, the first conductive type semiconductor layer is an n-type semiconductor layer and the second conductive type semiconductor layer is a p-type semiconductor layer.

The semiconductor layer is not specifically limited and any nitride semiconductor systems such as InAlGaP system, InP system, AlGaAs system, a mixed crystal thereof, and GaN system can be used.

Examples of the nitride semiconductor include GaN, AlN or In, or a group III-V nitride semiconductor $(In_xAl_yGa_{1-x-y}N$ ($0 \leq x$, $0 \leq y$, $x+y \leq 1$) which is a mixed crystal thereof.

Moreover, a mixed crystal in which B may be used as a part or all of the III group element, or in which a part of N is replaced by P, As, or Sb as the V-group element.

In such semiconductor layers, in general, an impurity of either n-type or p-type is doped.

The structure of the semiconductor light emitting element may be a layered structure such as a homostructure, heterostructure, or double heterostructure, with an MIS junction, PIN junction, or P-N junction.

A semiconductor crystal can be grown by using a known method, for example, a Metalorganic Chemical Vapor Deposition (MOCVD) growth method, a Hydride Vapor Phase Epitaxy (HVPE) growth method, and a Molecular Beam Epitaxial (MBE) growth method.

The thickness of the semiconductor layer is not specifically limited and the semiconductor layer of various thickness can be employed.

The light emitting element of the present invention can suitably employ a structure in which the first and second electrode forming surface side is light reflecting side and the semiconductor structure 101 side facing thereof, for example, the substrate 10 side is light extracting side, and applicable to the element layered body and the light emitting element or the light emitting device mounting the element layered body.

INDUSTRIAL APPLICABILITY

The present invention can be utilized in a light source of a floodlight such as a car headlamp, a light source of lighting, a light source of a backlight for a cell phone etc., a signal, a lighted switch, a vehicle-mounted stoplight, various sensors, and various indicators etc.

DENOTATION OF REFERENCE NUMERALS

10: substrate
11: first conductive type layer
12: light emitting layer
13: second conductive type layer
101: element layered structure
121: light emitting structure part 122: first electrode forming part (extended part)
127: element structure region
20: first electrode
21: first layer
22: second layer
23: base part
24: extended part
25: external connecting part
20A, 23A, 24A: first electrode, base part, extended art in secondary array direction
30: second electrode
31: external connecting portion (31x: pad electrode)
32: group region
32A: group region in secondary array direction
40: insulating film
50: electromigration concentrating portion
51: degenerated part near current constricting portion

What is claimed is:

1. A semiconductor light emitting device comprising:
a first electrode and a second electrode respectively provided on a first conductive type semiconductor layer and a second conductive type semiconductor layer on a same surface side,
the first conductive type semiconductor layer having a different conductive type from the second conductive type semiconductor layer, and
an insulating film disposed on the second electrode, and at least one opening in the insulating film exposing at least one region, said at least one region forming at least one external connecting part of the second electrode,
wherein in the same surface side:
the first electrode comprises a plurality of first electrodes arranged to form a one-dimensional first electrode array, wherein said first electrodes are not connected to each other in said surface side on the first conductive type semiconductor layer, and
each of said first electrodes in said plurality of first electrodes comprises a base part, and two extended parts extending from the base part,
such that said plurality of first electrodes comprise a plurality of said base parts,
wherein
said plurality of base parts are aligned in the one-dimensional direction of the first electrode array,
a first plurality of extended parts includes one of said two extended parts from each of said first electrodes,
a second plurality of extended parts includes the other of said two extended parts from each of said first electrodes,
said first plurality of extended parts are aligned in the one-dimensional direction of the first electrode array, on a first side of said plurality of base parts, and
said second plurality of extended parts are aligned in the one-dimensional direction of the first electrode array, on a second side opposite to said first side of said plurality of base parts, and
a portion of said at least one external connecting part of the second electrode is arranged in between two extended parts of different first electrodes in the first electrode array, such that said portion of said at least one external connecting part overlaps with the two extended parts of said different first electrodes, in the one-dimensional direction of the first electrode array.

2. The semiconductor light emitting device according to claim 1, wherein, in said surface side, said base part of one of said first electrodes has a curved shape.

3. The semiconductor light emitting device according to claim 1, wherein, in said surface side, the two extended parts of one of said first electrodes extend, along an extending direction, from opposite sides of the base part of said one first electrode.

4. The semiconductor light emitting device according to claim 1, wherein, in said surface side, another external connecting part of the second electrode is located between
an edge of said first conductive type semiconductor layer and
one of said first electrodes.

5. The semiconductor light emitting device according to claim 1, wherein, in said surface side,
the two extended parts of one of said first electrodes extend, along an extending direction, from opposite sides of the base part of said one first electrode, and
no external connecting part of the second electrode is provided along the extending direction that passes through said two extended parts.

6. The semiconductor light emitting device according to claim 1, wherein the first electrode comprises a first layer of an Al alloy.

7. The semiconductor light emitting device according to claim 1, wherein the first electrode comprises a first layer of an Al alloy at a contacting side with the first conductive type semiconductor layer, and a second layer on the first layer, and
the Al alloy contains Cu or Si and Cu.

8. The semiconductor light emitting device according to claim 1, wherein at least one of said first conductive type and second conductive type semiconductor layers comprises a nitride semiconductor.

9. The semiconductor light emitting device according to claim 8, wherein the nitride semiconductor comprises $In_xAl_yGa_{1-x-y}N$, $0 \leq x$, $0 \leq y$, and $x+y \leq 1$.

10. The semiconductor light emitting device according to claim 6, wherein at least one of said first conductive type and second conductive type semiconductor layers comprises a nitride semiconductor.

11. The semiconductor light emitting device according to claim 2, wherein, in said surface side, the two extended parts of one of said first electrodes extend, along an extending direction, from opposite sides of the base part of said one first electrode.

12. The semiconductor light emitting device according to claim 11, wherein at least one of said first conductive type and second conductive type semiconductor layers comprises a nitride semiconductor.

13. The semiconductor light emitting device according to claim 12, wherein the first electrode comprises an Al alloy.

14. The semiconductor light emitting device according to claim 2, wherein, in said surface side, another external connecting part of the second electrode is located between
an edge of said first conductive type semiconductor layer and
one of said first electrodes.

15. The semiconductor light emitting device according to claim 14, wherein at least one of said first conductive type and second conductive type semiconductor layers comprises a nitride semiconductor.

16. The semiconductor light emitting device according to claim 15, wherein the first electrode comprises an Al alloy.

17. The semiconductor light emitting device according to claim 2, wherein, in said surface side, the two extended parts of one of said first electrodes extend, along an extending direction, from opposite sides of the base part of said one first electrode, and no external connecting part of the second electrode is provided along the extending direction that passes through said two extended parts.

18. The semiconductor light emitting device according to claim 17, wherein, in said surface side, another external connecting part of the second electrode is located between an edge of said first conductive type semiconductor layer and one of said first electrodes.

19. The semiconductor light emitting device according to claim 18, wherein at least one of said first conductive type and second conductive type semiconductor layers comprises a nitride semiconductor.

20. The semiconductor light emitting device according to claim 19, wherein the first electrode comprises an Al alloy.

21. The semiconductor light emitting device according to claim 1, wherein said at least one opening in the insulating film comprises a plurality of openings in the insulating film which are separated from each other, exposing regions which are external connecting parts of the second electrode spaced from each other, wherein in said surface side:

a plurality of the external connecting parts of the second electrode are arranged to form a second electrode array substantially parallel to the first electrode array, and the second electrode array is provided to partially overlap with extended parts of different first electrodes, in the one-dimensional direction of the first electrode array.

* * * * *